(12) United States Patent
Saito

(10) Patent No.: US 12,300,475 B2
(45) Date of Patent: May 13, 2025

(54) SUBSTRATE SUPPORT AND SUBSTRATE PROCESSING APPARATUS

(71) Applicant: Tokyo Electron Limited, Tokyo (JP)

(72) Inventor: Michishige Saito, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 501 days.

(21) Appl. No.: 17/701,744

(22) Filed: Mar. 23, 2022

(65) Prior Publication Data

US 2022/0310367 A1 Sep. 29, 2022

(30) Foreign Application Priority Data

Mar. 23, 2021 (JP) .................. 2021-048614

(51) Int. Cl.
*H01J 37/20* (2006.01)
*H01J 37/32* (2006.01)
*H01L 21/67* (2006.01)
*H01L 21/687* (2006.01)
*H01L 21/683* (2006.01)

(52) U.S. Cl.
CPC .. *H01J 37/32724* (2013.01); *H01L 21/67109* (2013.01); *H01L 21/68785* (2013.01); *H01L 21/6833* (2013.01)

(58) Field of Classification Search
CPC ......... H01J 37/32724; H01L 21/67109; H01L 21/68785; H01L 21/6833; C23C 16/463; C23C 14/541; C23C 16/4586
See application file for complete search history.

(56) References Cited

U.S. PATENT DOCUMENTS

| | | | | |
|---|---|---|---|---|
| 2001/0045269 A1* | 11/2001 | Yamada | ............ | H01L 21/67103 165/80.4 |
| 2008/0073324 A1* | 3/2008 | Nogami | ............. | H01L 21/6838 156/345.37 |
| 2009/0159566 A1* | 6/2009 | Brillhart | ............. | C23C 16/4586 427/523 |
| 2016/0099161 A1* | 4/2016 | Kawamata | .......... | H01L 21/3065 438/710 |
| 2019/0066985 A1* | 2/2019 | Hirose | ................ | H01L 21/6831 |

FOREIGN PATENT DOCUMENTS

| | | |
|---|---|---|
| JP | 2001-332608 A | 11/2001 |
| JP | 2002-009049 A | 1/2002 |
| JP | 2017-506825 A | 3/2017 |
| JP | 2018-125463 A | 8/2018 |
| JP | 2019-41024 A | 3/2019 |
| JP | 2020-126900 A | 8/2020 |

\* cited by examiner

*Primary Examiner* — Aiden Lee
(74) *Attorney, Agent, or Firm* — XSENSUS LLP

(57) ABSTRACT

There is provided a substrate support comprising: a base; a first flow path that opens on a bottom surface of the base at a central portion of the base; a second flow path that surrounds the first flow path and opens on the bottom surface of the base; at least one third flow path communicating with the first flow path and arranged from the central portion toward an outer peripheral portion of the base; and at least one fourth flow path communicating with the second flow path, arranged from the central portion toward the outer peripheral portion of the base, and communicating with the at least one third flow path at the outer peripheral portion of the base.

13 Claims, 7 Drawing Sheets

SUBSTRATE SUPPORT AND SUBSTRATE PROCESSING APPARATUS

CROSS-REFERENCE TO RELATED APPLICATIONS

This application claims priority to Japanese Patent Application No. 2021-048614 filed on Mar. 23, 2021, the entire contents of which are incorporated herein by reference.

TECHNICAL FIELD

The present disclosure relates to a substrate support and a substrate processing apparatus.

BACKGROUND

For example, Japanese Patent Application Publication No. 2019-41024 discloses a substrate support having a base in which a flow path for a coolant is formed and a protrusion member disposed in the flow path.

SUMMARY

The present disclosure provides a technique capable of improving controllability of a substrate temperature.

In accordance with an aspect of the present disclosure, there is provided a substrate support comprising: a base; a first flow path that opens on a bottom surface of the base at a central portion of the base; a second flow path that surrounds the first flow path and opens on the bottom surface of the base; at least one third flow path communicating with the first flow path and arranged from the central portion toward an outer peripheral portion of the base; and at least one fourth flow path communicating with the second flow path, arranged from the central portion toward the outer peripheral portion of the base, and communicating with the at least one third flow path at the outer peripheral portion of the base.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
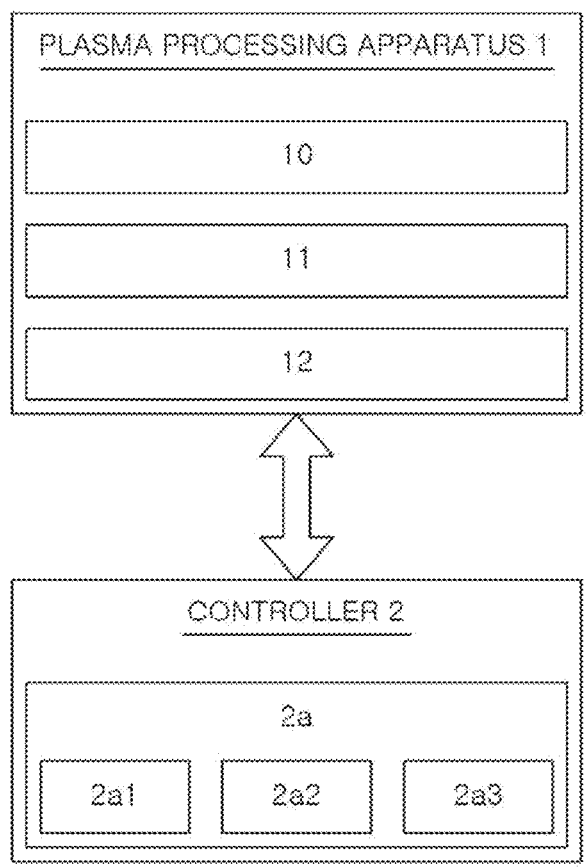
FIG. 1 is a schematic cross-sectional view showing an example of a plasma processing system according to an embodiment.

Hereinafter, embodiments of the present disclosure will be described in detail with reference to the accompanying drawings. Like reference numerals will be given to like parts throughout the drawings, and redundant description thereof may be omitted.

(Plasma Processing System)

In one embodiment, a plasma processing system shown in FIG. 1 includes a plasma processing apparatus 1 and a controller 2. The plasma processing apparatus 1 includes a plasma processing chamber 10, a substrate support 11, and a plasma generator 12. The plasma processing chamber 10 has a plasma processing space. Further, the plasma processing chamber 10 has at least one gas inlet for supplying at least one processing gas to the plasma processing space, and at least one gas outlet for exhausting gases from the plasma processing space. The gas inlet is connected to a gas supplier 20 to be described later, and the gas outlet is connected to an exhaust system 40 to be described later. The substrate support 11 is disposed in the plasma processing space and has a substrate support surface for supporting a substrate.

The plasma generator 12 is configured to generate plasma from at least one processing gas supplied into the plasma processing space. The plasma generated in the plasma processing space may be capacitively coupled plasma (CCP), inductively coupled plasma (ICP), electron-cyclotron-resonance (ECR) plasma, a helicon wave plasma (HWP), surface wave plasma (SWP), or the like. Further, various types of plasma generators including an alternating current (AC) plasma generator and a direct current (DC) plasma generator may be used. In one embodiment, an AC signal (AC power) used in the AC plasma generator has a frequency within a range of 100 kHz to 10 GHz. Therefore, the AC signal includes a radio frequency (RF) signal and a microwave signal. In one embodiment, the RF signal has a frequency within a range of 200 kHz to 150 MHz.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, the controller 2 may be partially or entirely included in the plasma processing apparatus 1. The controller 2 may include, e.g., a computer 2a. The computer 2a may include, e.g., a central processing unit (CPU) 2a1, a storage device 2a2, and a communication interface 2a3. The central processing unit 2a1 may be configured to perform various control operations based on a program stored in the storage device 2a2. The storage device 2a2 may include a random access memory (RAM), a read only memory (ROM), a hard disk drive (HDD), a solid state drive (SSD), or a combination thereof. The communication interface 2a3 may communicate with the plasma processing apparatus 1 through a communication line such as a local area network (LAN) or the like.

Figure 2:
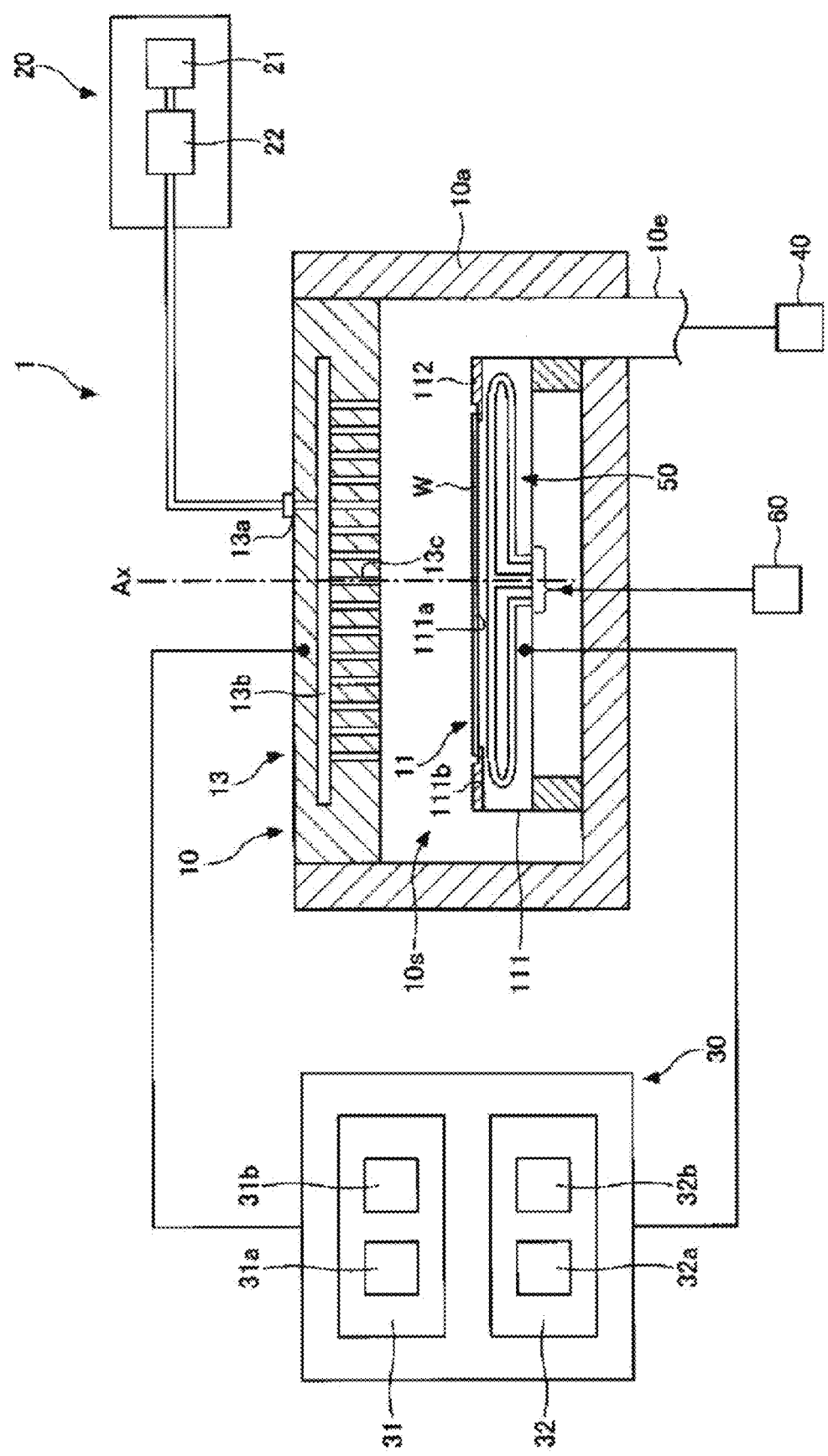
FIG. 2 shows an example of a plasma processing apparatus according to an embodiment.

Next, a configuration example of a capacitively coupled plasma processing apparatus 1 as an example of the plasma processing apparatus 1 will be described with reference to FIG. 2. The plasma processing apparatus 1 is an example of a substrate processing apparatus. The plasma processing apparatus 1 includes the plasma processing chamber 10, the gas supplier 20, a power supply 30, and the exhaust system 40. The plasma processing apparatus 1 further includes the substrate support 11 and a gas inlet portion. The gas inlet portion is configured to introduce at least one processing gas into the plasma processing chamber 10. The gas inlet portion includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10s defined by the shower head 13, a sidewall 10a of the plasma processing chamber 10, and the substrate support 11. The sidewall 10a is grounded. The shower head 13 and the substrate support 11 are electrically isolated from the plasma processing chamber 10.

The substrate support 11 includes a base 111, an electrostatic chuck, and a ring assembly 112. The electrostatic chuck is disposed on the base 111. An upper surface of the electrostatic chuck has a central region (substrate supporting surface) 111a for supporting the substrate (wafer) W and an annular region (ring supporting surface) 111b for supporting the ring assembly 112. The annular region 111b of the electrostatic chuck surrounds the central region 111a of the electrostatic chuck in plan view. The substrate W is disposed on the central region 111a of the electrostatic chuck, and the ring assembly 112 is disposed on the annular region 111b of the electrostatic chuck to surround the substrate W on the central region 111a of the electrostatic chuck. In one embodiment, the base 111 includes a conductive member, and the conductive member of the base 111 functions as a lower electrode. The ring assembly 112 includes one or more annular members. At least one of them is an edge ring. Further, although it is not illustrated, the substrate support 11 may include a temperature control module configured to adjust at least one of the electrostatic chuck, the ring assembly 112, and the substrate W to a target temperature. The temperature control module may include a heater, a heat transfer medium, a flow path, or a combination thereof. Further, the substrate support 11 may include a heat transfer gas supplier configured to supply a heat transfer gas to a space between the backside of the substrate W and the substrate supporting surface 111a.

The shower head 13 is configured to introduce at least one processing gas from the gas supplier 20 into the plasma processing space 10s. The shower head 13 has at least one gas supply port 13a, at least one gas diffusion space 13b, and a plurality of gas inlet ports 13c. The processing gas supplied to the gas supply port 13a passes through the gas diffusion space 13b and is introduced into the plasma processing space 10s from the gas inlet ports 13c. Further, the shower head 13 includes a conductive member. The conductive member of the shower head 13 functions as an upper electrode. The gas inlet portion may include, in addition to the shower head 13, one or multiple side gas injector (SGI) attached to one or multiple openings formed in the sidewall 10a.

The gas supplier 20 may include at least one gas source 21 and at least one flow rate controller 22. In one embodiment, the gas supplier 20 is configured to supply at least one processing gas from the corresponding gas source 21 to the shower head 13 through the corresponding flow rate controller 22. The flow rate controllers 22 may include, e.g., a mass flow controller or a pressure-controlled flow rate controller. Further, the gas supplier 20 may include one or more flow rate modulation device for modulating the flow rate of at least one processing gas or causing it to pulsate.

The power supply 30 includes an RF power supply 31 connected to the plasma processing chamber 10 through at least one impedance matching circuit. The RF power supply 31 supplies at least one RF signal (RF power), such as a source RF signal and a bias RF signal, to the conductive member of the substrate support 11 and/or the conductive member of the shower head 13. Accordingly, plasma is produced from at least one processing gas supplied to the plasma processing space 10s. Hence, the RF power supply 31 may function as at least a part of the plasma generator 12. Further, by supplying the bias RF signal to the conductive member of the substrate support 11, a bias potential is generated in the substrate W, and ions in the produced plasma can be attracted to the substrate W.

In one embodiment, the RF power supply 31 includes a first RF generator 31a and a second RF generator 31b. The first RF generator 31a is connected to the conductive member of the substrate support 11 and/or the conductive member of the shower head 13 through at least one impedance matching circuit. Further, the first RF generator 31a is configured to generate a source RF signal (source RF power) for plasma generation. In one embodiment, the source RF signal has a frequency within a range of 13 MHz to 150 MHz. In one embodiment, the first RF generator 31a may be configured to generate multiple source RF signals having different frequencies. The generated one or multiple source RF signals are supplied to the conductive member of the substrate support 11 and/or the conductive member of the shower head 13. The second RF generator 31b is connected to the conductive member of the substrate support 11 through at least one impedance matching circuit, and is configured to generate a bias RF signal (bias RF power). In one embodiment, the bias RF signal has a frequency lower than that of the source RF signal. In one embodiment, the bias RF signal has a frequency within a range of 400 kHz to 13.56 MHz. In one embodiment, the second RF generator 31b may be configured to generate multiple bias RF signals having different frequencies. The generated one or multiple bias RF signals are supplied to the conductive member of the substrate support 11. In various embodiments, at least one of the source RF signal and the bias RF signal may pulsate.

The power supply 30 may include a DC power supply 32 connected to the plasma processing chamber 10. The DC power supply 32 includes a first DC generator 32a and a second DC generator 32b. In one embodiment, the first DC generator 32a is connected to the conductive member of the substrate support and is configured to generate a first DC signal. The generated first DC signal is applied to the conductive member of the substrate support 11. In one embodiment, the first DC signal may be applied to another electrode, such as an electrode in an electrostatic chuck. In one embodiment, the second DC generator 32b is connected to the conductive member of the shower head 13 and is configured to generate a second DC signal. The generated second DC signal is applied to the conductive member of the shower head 13. In various embodiments, the first and second DC signals may pulsate. Further, the first DC generator 32a and the second DC generator and 32b may be provided in addition to the RF power supply 31, and the first DC generator 32a may be provided instead of the second RF generator 31b.

The exhaust system 40 may be connected to a gas outlet 10e disposed at a bottom portion of the plasma processing chamber 10, for example. The exhaust system 40 may include a pressure control valve and a vacuum pump. The pressure control valve adjusts a pressure in the plasma processing space 10s. The vacuum pump may include a turbo molecular pump, a dry pump, or a combination thereof.

(Flow Path)

The base 111 is made of aluminum, and a flow path 50 is formed in the base 111. The flow path 50 is axially symmetrical with respect to a central axis Ax of the disc-shaped base 111. The central axis of the base 111 coincides with the central axis of the cylindrical plasma processing chamber 10.

Both an inlet and an outlet of the flow path 50 are disposed at a central portion of the base 111. The inlet and the outlet of the flow path 50 are connected to a chiller unit 60. A heat exchange medium such as brine or the like is controlled to a desired temperature by the chiller unit 60, and flows into the flow path 50 from the inlet disposed at the central portion of the base 111. The heat exchange medium flows from the central portion toward the outer side, and returns back at the outer peripheral portion. Then, the heat exchange medium flows from the outer peripheral portion toward the central portion, and flows out from the outlet disposed at the central portion. Then, the heat exchange medium returns to the chiller unit 60. In this manner, the heat exchange medium circulates between the chiller unit 60 and the flow path 50.

Figure 3:
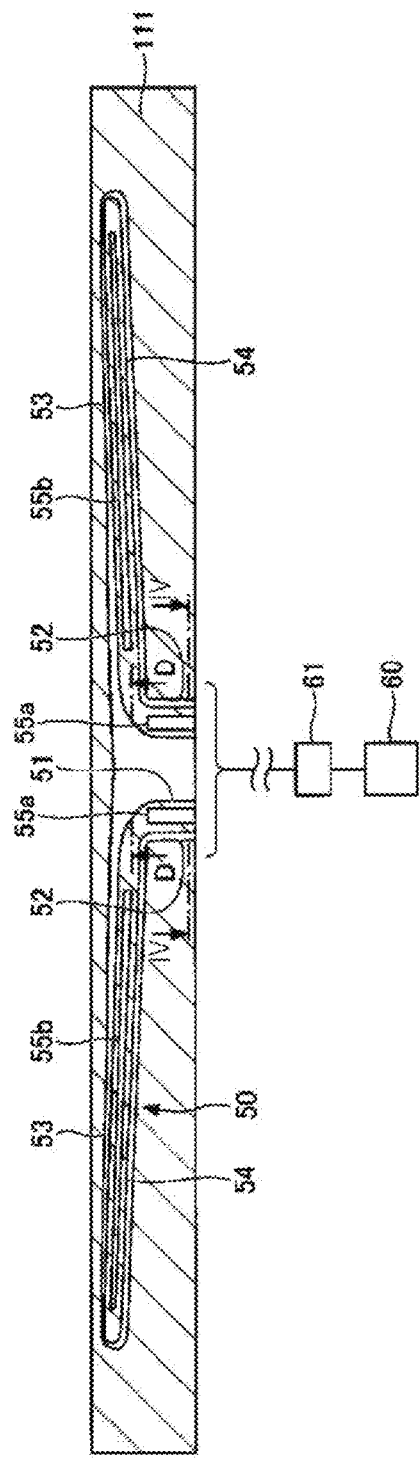
FIG. 3 is an enlarged cross-sectional view of a flow path in a base of a substrate support according to an embodiment.

Next, the flow path 50 in the base 111 will be described in detail with reference to FIGS. 3 to 5. FIG. 3 is an enlarged cross-sectional view of the flow path 50 in the base 111 according to an embodiment. As shown in FIG. 3, the flow path 50 is formed in the base 111, and has a first flow path 51, a second flow path 52, third flow paths 53, and fourth flow paths 54. The first flow path 51 opens on the bottom side of the base 111 at the central portion of the base 111. The first flow path 51 is disposed substantially vertically at the central portion of the base 111. Alternatively, the first flow path 51 may be disposed in a tapered shape or inclined at the central portion of the base 111. The second flow path 52 is configured to surround the first flow path 51. The second flow path 52 opens on the bottom side of the base 111 to surround the opening of the first flow path 51 at the central portion of the base 111.

The third flow paths 53 communicate with the first flow path 51, and are arranged from the central portion toward the outer peripheral portion of the base 111. The fourth flow paths 54 communicate with the second flow path 52, and are arranged along the third flow paths 53 from the central portion toward the outer peripheral portion of the base 111. The fourth flow paths 54 communicate with the third flow paths 53. The third flow paths 53 are arranged on an upper surface side of the base 111, and the fourth flow paths 54 are arranged below the third flow paths 53. When the heat exchange medium flows in from the first flow path 51, the third flow path 53 serves as an outward path and the fourth flow path 54 serves as a return path, so that the second flow path 52 serves as the outlet of the heat exchange medium. When the heat exchange medium flows in from the second flow path 52, the fourth flow path 54 serves as the outward path and the third flow path 53 serves as the return path, so that the first flow path 51 serves as the outlet of the heat exchange medium.

The opening of the first flow path 51 and the opening of the second flow path 52 are connected to the chiller unit 60 through lines (not shown). The opening of the first flow path 51 may serve as the inlet of the heat exchange medium, or the opening of the second flow path 52 may serve as the inlet of the heat exchange medium.

When the opening of the first flow path 51 serves as the inlet of the heat exchange medium and the opening of the second flow path 52 serves as the outlet of the heat exchange medium, an improved cooling effect can be obtained on the substrate W side, i.e., the upper surface side of the base 111 or the central portion of the base 111. On the other hand, when the opening of the second flow path 52 serves as the inlet of the heat exchange medium and the opening of the first flow path 51 serves as the outlet of the heat exchange medium, an improved cooling effect can be obtained on an outer peripheral side of the substrate W, i.e., the bottom surface side of the base 111 or the outer peripheral side of the base 111.

A switching valve 61 may be disposed between the first and second flow paths 51 and 52 and the chiller unit 60. The switching valve 61 can switch the function of the first flow path 51 and the second flow path 52 between the inlet of the heat exchange medium and the outlet of the heat exchange medium. Alternatively, the switching valve 61 may be omitted.

Figure 4:
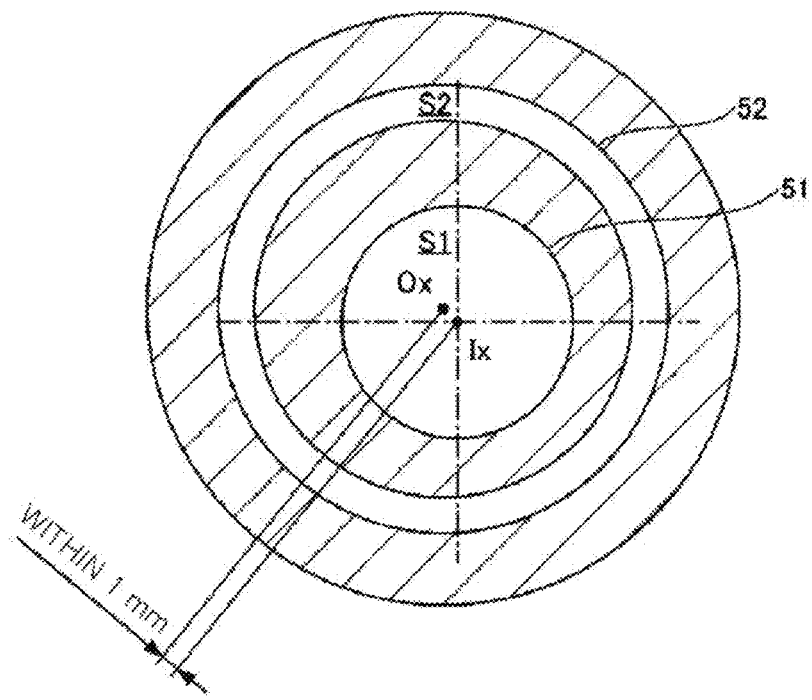
FIG. 4 is a cross-sectional view taken along an A-A plane of FIG. 3.

FIG. 4 shows a cross section taken along an A-A plane of FIG. 3. As shown in FIG. 4, the first flow path 51 and the second flow path 52 are coaxially arranged. In this specification, the term "coaxially arranged" includes a case where the central axis of the first flow path 51 and the central axis of the second flow path 52 completely coincide with each other and also includes the amount of deviation that can be included in a manufacturing process.

For example, as shown in FIG. 4, the central axis of the first flow path 51 is set to Ix, and the central axis of the second flow path 52 is set to Ox. When the amount of deviation between the central axis Ix of the first flow path 51 and the central axis Ox of the second flow path 52 is less than 1 mm as a shortest distance, it is considered that the first flow path 51 and the second flow path 52 are coaxially arranged because 1 mm is the amount of deviation that can be included in a manufacturing process. Further, the central axis Ix of the first flow path 51 and the central axis Ox of the second flow path 52 are coaxially arranged with the central axis Ax of the base 111.

Further, a ratio of a cross-sectional area S2 of the second flow path 52 with respect to a cross-sectional area S1$i$ of the first flow path 51 in the case where the first flow path 51 and the second flow path 52 arranged coaxially are cut in a direction perpendicular to a flow direction is 0.8 to 1.2.

The cross-section of the second flow path 52 may not have an annular shape as long as the second flow path 52 is coaxially disposed to surround the first flow path 51. For example, the cross-section of the second flow path 52 may have a polygonal ring shape such as a triangular ring shape or a quadrangular ring shape, or may have another shape. Similarly, the cross-section of the first flow path 51 may not have an elliptical shape. For example, the cross-section of the first flow path 51 may have a polygonal shape such as an elliptical shape, a triangular shape, a quadrangular shape, or the like, or may have another shape.

As described above, the flow path 50 has the first flow path 51 and the second flow path 52 that function as the inlet and the outlet of the heat exchange medium at the central portion of the base 111, and the first flow path 51 and the second flow path 52 have a coaxial structure. The central portion of the base 111 indicates an innermost peripheral region in the case where the radius of the base 111 is divided into three equal parts. The outer peripheral portion of the base 111 indicates an outermost peripheral region in the case where the radius of the base 111 is divided into three equal parts. The intermediate portion of the base 111 indicates a region between the inner peripheral portion and the outer peripheral portion.

Referring back to FIG. 3, an insulating space 55$a$ is disposed between the first flow path 51 and the second flow path 52. The heat exchange medium flows in from one of the first flow path 51 and the second flow path 52, and flows out from the other. Since the heat exchange medium absorbs heat of the substrate W while flowing through the flow path 50, the temperature of the heat exchange medium flowing out increases, and a temperature difference occurs between the heat exchange medium flowing out and the heat exchange medium flowing in. Therefore, the insulating space 55a is disposed between the first flow path 51 and the second flow path 52 in order to minimize the influence of heat interference between the heat exchange media flowing therethrough. Similarly, an insulating space 55b is disposed between the third flow path and the fourth flow path 54 in order to minimize the influence of heat interference between the heat exchange media flowing therethrough.

Figure 5A:
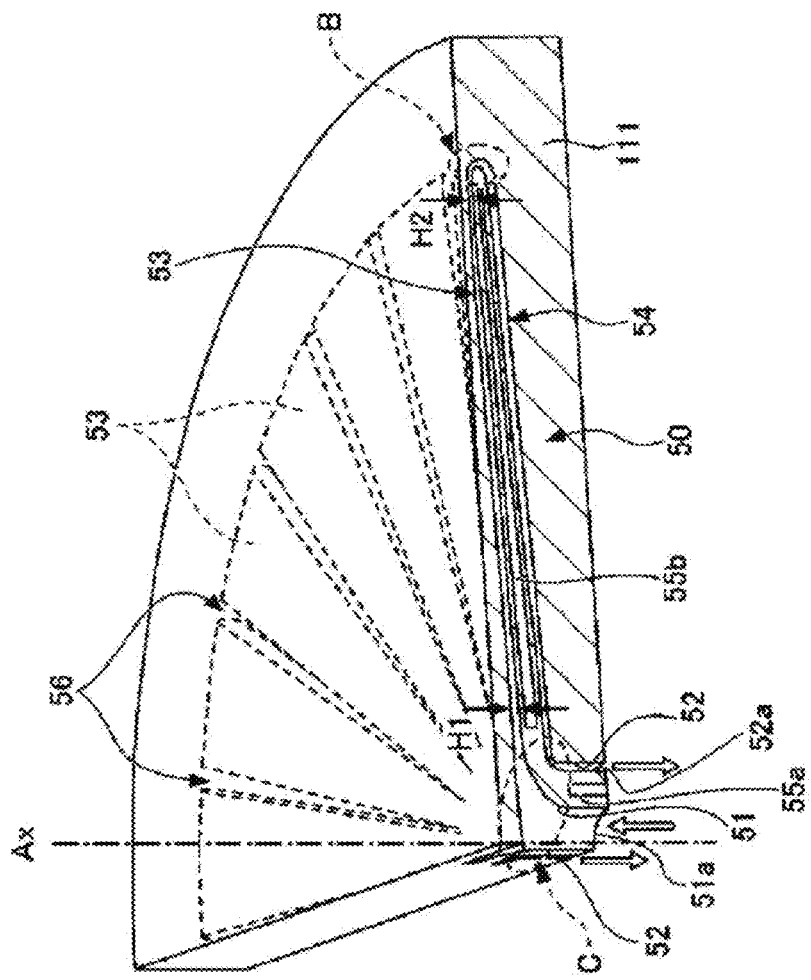
FIGS. 5A and 5B are respectively a perspective view and a plan view showing the flow path in the base of the substrate support according to the embodiment.

FIG. 5A is a perspective view showing the flow path 50 in the base 111 in the case where the base 111 according to the embodiment is cut into ¼ at an angle of 90° from the central axis Ax. In the example of FIG. 5A, the heat exchange medium flows in from the inlet 51a of the first flow path 51 and flows from the bottom to the top toward an upper surface of the base 111 in a substantially vertical direction. Alternatively, the heat exchange medium may flow in from the second flow path 52.

The first flow path 51 is gently curved outward at the central portion of the base 111 by about 90° to change its direction. The first flow path 51 communicates with the third flow paths 53 and spreads radially. The heat exchange medium flowing through the first flow path 51 changes its direction from the central portion of the base 111 toward the outer side, and flows through the radially formed third flow paths 53 along the upper surface of the base 111.

The second flow path 52 is curved outward by about 90° at the central portion of the base 111 to change its direction. The second flow path 52 communicates with the fourth flow paths 54 and spreads radially. The fourth flow paths 54 are folded back by about 180° at the outer peripheral portion of the base 111 to change directions and communicate with the third flow paths 53.

The heat exchange medium flows from the central portion to the outer peripheral portion of the third flow paths 53, and returns back at the outer peripheral portion. The heat exchange medium flows from the outer peripheral portion to the central portion of the fourth flow paths 54 below the third flow paths 53 along the third flow paths 53. The heat exchange medium is curved by about 90° at the central portion to change its direction. Then, the heat exchange medium flows through the second flow path 52 in a substantially vertical direction from the top to the bottom, and flows out from the outlet 52a of the second flow path 52.

Figure 5B:
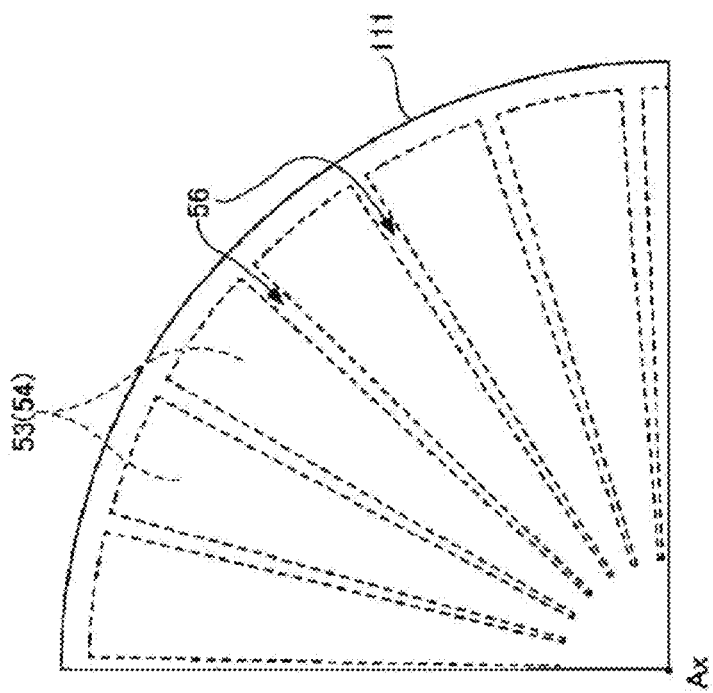

FIG. 5B is a plan view of the base 111 of FIG. 5A. The substantially fan-shaped third flow paths 53 are formed in the base 111, and are arranged radially. The fourth flow paths 54 are formed in a substantially fan shape, similarly to the third flow paths 53, below the third flow paths 53 to overlap the third flow paths 53, and are arranged radially. Therefore, the fourth flow paths 54 overlapping the third flow paths 53 are not seen in FIG. 5B.

As shown in FIG. 5A, a distance in a height direction of the third flow paths 53 decreases toward the outer peripheral portion. For example, a height H2 of the third flow path 53 at the outer peripheral portion shown in FIG. 5A is smaller than a height H1 of the third flow path 53 at the central portion shown in FIG. 5. The distance in the height direction of the third flow path 53 may decreases toward the outer peripheral portion continuously or in a stepwise manner. For example, the third flow path 53 may have an upper surface formed in parallel with the upper surface of the base 111, and may have a bottom surface formed in an ascending staircase shape or a slope shape having an upward inclination toward the outer peripheral portion. Further, the third flow path 53 may have the bottom surface formed in parallel with the upper surface of the base 111, and may have the upper surface formed in a descending staircase shape or a slope shape having a downward inclination toward the outer peripheral portion.

Accordingly, the distance in the height direction of the third flow paths 53 decreases toward the outer peripheral portion, and the cross-sectional area of the third flow path 53 becomes smaller than that of the third flow path 53 whose height is constant. Hence, the flow velocity of the heat exchange medium flowing through the third flow paths 53 does not slow down when the heat exchange medium flows from the central portion toward the outer side. As a result, it is possible to suppress a decrease in the heat transfer efficiency in the case where the heat exchange medium flows from the central portion to the outer peripheral portion, and also possible to obtain desired heat uniformity in the temperature control of the substrate W.

Figure 6:
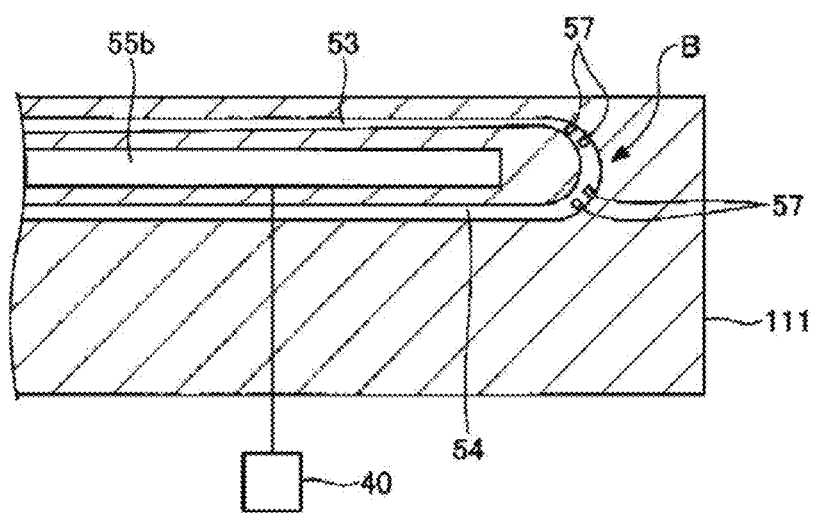
FIG. 6 shows a diffusion member disposed in the flow path according to the embodiment.

Particularly, in the structure of the flow path 50 of the present disclosure, the heat exchange medium flowing through the third flow path 53 mainly absorbs the heat of the substrate W, so that the temperature of the heat exchange medium increases. Therefore, as shown in FIG. 6, the exhaust system 40 is connected to the insulating space 55b, and the insulating space 55b is evacuated by the vacuum pump of the exhaust system 40. Accordingly, the insulating space 55b can serve as a vacuum insulating space, and the insulating effect can be improved. Hence, it is possible to suppress a decrease in the heat absorption efficiency due to the influence of heat interference between the heat exchange media flowing through the third flow path 53 and the fourth flow path 54. Similarly, the insulating effect may be enhanced by connecting the insulating space 55a to the exhaust system 40 and evacuating the insulating space 55a. Accordingly, it is possible to suppress a decrease in the heat absorption efficiency due to the influence of heat interference between the heat exchange media flowing between the first flow path 51 and the second flow path 52.

Referring back to FIG. 5, there are multiple third flow paths 53 and multiple fourth flow paths 54, and multiple heat dissipation fins 56 for dividing the third flow paths 53 are formed between the third flow paths 53. Further, multiple heat dissipation fins 56 for dividing the fourth flow paths 54 are formed between the fourth flow paths 54. The heat dissipation fins 56 for dividing the third flow paths 53 and the heat dissipation pins 56 for dividing the fourth flow path 54 are arranged radially at equal intervals around 360° from the central portion toward the outer peripheral portion of the base 111 to respectively divide the third flow paths 53 and the fourth flow paths 54 into substantially fan-shaped flow paths. Accordingly, the heat exchange media flowing through the third flow paths 53 and the fourth flow paths 54 are brought into contact with the heat dissipation fins 56, thereby improving a heat removal property.

The heat dissipation fins 56 are configured to become thicker from the central portion toward the outer peripheral portion, and the cross-sectional areas of the heat dissipation fins 56 become greater toward the outer peripheral portion. Accordingly, the difference between the cross-sectional area of the outer peripheral portion and the cross-sectional area of the central portion of the third flow path 53 can be reduced, and the difference between the cross-sectional area of the outer peripheral portion and the cross-sectional area of the central portion of the fourth flow path 54 can be reduced. Hence, a decrease in the flow velocity of the heat exchange media flowing through the third flow paths 53 and the fourth flow paths 54 is suppressed, which makes it possible to obtain desired heat uniformity and avoid occurrence of a singular point of temperature in the flow path.

FIGS. 5A and 5B illustrate the example in which the heat dissipation fins 56 are evenly arranged at a predetermined angle and become thicker toward the outer peripheral portion. However, the present disclosure is not limited thereto, and the number of heat dissipation fins 56 may increase toward the outer peripheral portion. For example, heat dissipation fins shorter than the heat dissipation fins 56 of FIG. 5 may be further arranged at the outer peripheral portion to be located between the heat dissipation fins 56 of FIG. 5.

The height of the third flow paths 53 is lowered at the outer peripheral portion than at the central portion to suppress a decrease in the flow velocity of the heat exchange medium. Further, the number or cross-sectional areas of the heat dissipation fins 56 increases to widen the contact area with the heat exchange medium, thereby improving the efficiency of transferring heat from the heat exchange medium to the heat dissipation fins 56. Accordingly, it is possible to obtain desired temperature uniformity on the plane of the substrate W in controlling the temperature of the substrate W. Further, the height of the fourth flow paths 54 may decrease from the central portion toward the outer peripheral portion, or may be constant.

(Diffusion Member)

A diffusion member may be disposed in at least one of the first flow path 51, the second flow path 52, the third flow paths 53, and the fourth flow paths 54. The diffusion member disposed in the flow path 50 according to an embodiment will be described with reference to FIGS. 6 and 7.

A singular point of temperature occurs in the flow path 50. In other words, it is easy to cool a position where the flow velocity of the heat exchange medium is high, and it is difficult to cool a position where the flow velocity of the heat exchange medium is low. Therefore, a position where the flow of the heat exchange medium changes tends to be a singular point of temperature. For example, the flow of the heat exchange medium changes considerably in an area B where the third flow paths 53 and the fourth flow paths 54 of FIG. 5 communicate or in an area C including a ceiling surface of a flow passage of a portion where the first flow path 51 and the third flow paths 53 communicate and a portion where the second flow path 52 and the fourth flow paths 54 communicate. In other words, the area B or C where the flow velocity of the heat exchange medium changes becomes a singular point of temperature.

Therefore, it is preferable that the diffusion member is disposed in the flow path 50 to be located at or near a singular point of temperature. The diffusion member may be a convex member 57 shown in FIG. 6, or may be a screw 58, an elliptical member 59, or the like shown in FIGS. 7A to 7C, for example. However, the diffusion member is not limited thereto, and may be a member having a function of suppressing stagnation of the heat exchange medium in the flow path 50 or adjusting the flow velocity of the heat exchange medium. Further, the flow path 50 itself may have a concave portion and/or a convex portion.

The convex member 57 shown in FIG. 6 is disposed in the area B in the flow path 50 where the flow velocity of the heat exchange medium decreases, which corresponds to a singular point of temperature or its vicinity. The number of convex members 57 is not limited thereto, and one or more convex members 57 may be arranged. In the example of FIG. 6, the convex member 57 is disposed at a portion of the flow path 50 where the flow velocity of the heat exchange medium decreases. However, the convex member 57 may be disposed at a portion where the flow velocity of the heat exchange medium increases.

Figure 7A:
FIGS. 7A to 7C show diffusion members disposed in the flow path according to the embodiment.
Figure 7B:
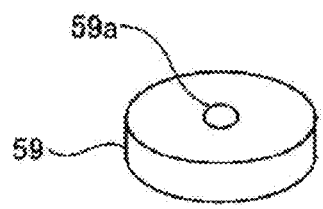
Figure 7C:
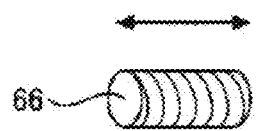

Instead of the convex member 57 shown in FIG. 6, diffusion members shown in FIGS. 7A to 7C may be used. In other words, the screw 58 shown in FIG. 7A, the elliptical member 59 shown in FIG. 7B, and an elevating screw 66 shown in FIG. 7C are examples of the diffusion member.

The screw 58 has a spiral groove. The elliptical member 59 can rotate around a shaft 59a, and a long side direction and a short side direction of an ellipse can be changed depending on the flow of the heat exchange medium. The elevating screw 66 can be raised and lowered. The screw 58, the elliptical member 59, and the elevating screw 66 adjust the flow direction and the flow velocity of the heat exchange medium. Accordingly, the heat removal response can be changed to correct a singular point of temperature.

The above-described diffusion member is an example, and the diffusion member may be a pin, an adjusting plate, a cylindrical protrusion or recess, a dimple-shaped concave portion and/or convex portion disposed in the flow path 50. The screw 58, the elliptical member 59, the elevating screw 66, the pin, the adjusting plate, the cylindrical protrusion or recess are examples of the concave portion and/or the convex portion of the diffusion member.

By arranging one or more diffusion members in the flow path 50, a heat transfer area can be increased and the decrease in the heat transfer efficiency can be suppressed. Further, a singular point can be corrected by adjusting the flow direction and the flow velocity of the heat exchange medium and changing the heat removal response. The diffusion member is preferably disposed at a singular point of temperature in the flow path 50. Further, it is not necessary to change the design of the flow path 50, and the singular point of temperature can be simply and easily corrected.

The substrate support 11 including the base 111 having the above-described flow path 50 may be manufactured by metal laminated modeling using a 3D printer.

(Effect)

A conventional flow path formed in the base 111 has an inlet and an outlet disposed at a part of the outer peripheral portion of the base 111. The conventional flow path forms a spiral shape from the outer peripheral portion toward the central portion, and returns back to form a spiral shape from the central portion toward the outer peripheral portion. Thus, the inlet and the outlet of the flow path as a singular point of temperature are shifted to a part of the outer peripheral portion, which makes it difficult to correct a singular point of temperature.

On the other hand, the flow path 50 of the present disclosure has the first flow path 51 and the second flow path 52 serving as the inlet and the outlet of the heat exchange medium at the central portion of the base 111, and the first flow path 51 and the second flow path 52 are coaxially arranged. This facilitates coaxial temperature control and improves controllability of coaxial temperature distribution, which makes it possible to improve the controllability of the temperature of the substrate W and the in-plane temperature uniformity of the substrate W.

The base 111 has a disc shape, and the substrate W as a temperature control target has a circular shape. Further, the heater disposed at the base 111 is divided into coaxial parts corresponding to the central portion, the intermediate portion, and the outer peripheral portion of the substrate support 11 (the base 111 or the electrostatic chuck). The plasma processing chamber 10 has a cylindrical shape. In other words, the central axes of the substrate W, the heater, and the plasma processing chamber 10 coincide with the central axis Ax of the base 111, and are coaxially arranged.

Therefore, in the flow path 50 of the present disclosure, the first flow path 51 and the second flow path 52 are coaxially arranged. Since the flow path 50 is coaxially disposed with the substrate W, the heater, and the plasma processing chamber 10, the coaxial temperature control is facilitated and the controllability of the coaxial temperature distribution is improved. Accordingly, the controllability of the temperature of the substrate W and the in-plane temperature uniformity of the substrate W can be improved.

The substrate support and the substrate processing apparatus according to the embodiments of the present disclosure are considered to be illustrative in all respects and not restrictive. The above-described embodiments can be changed and modified in various forms without departing from the scope of the appended claims and the gist thereof. The above-described embodiments may include other configurations without contradicting each other and may be combined without contradicting each other.

The substrate processing apparatus of the present disclosure may be applied to any type of apparatus such as an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance (ECR) processing apparatus, and a helicon wave plasma (HWP) apparatus.

Although the plasma processing apparatus has been described as an example of the substrate processing apparatus, the substrate processing apparatus is not limited to the plasma processing apparatus and may be any apparatus that performs predetermined processing (e.g., film formation, etching, or the like) on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate support comprising:
a base;
a first flow path that opens on a bottom surface of the base at a central portion of the base;
a second flow path that surrounds the first flow path and opens on the bottom surface of the base;
a plurality of third flow paths communicating with the first flow path and arranged from the central portion toward an outer peripheral portion of the base; and
a plurality of fourth flow paths communicating with the second flow path, arranged from the central portion toward the outer peripheral portion of the base, and communicating with the plurality of third flow paths at the outer peripheral portion of the base;
a plurality of first heat dissipation fins continuously extending between the plurality of third flow paths such that each first heat dissipation fin of the plurality of first heat dissipation fins is between two third flow paths of the plurality of third flow paths; and
a plurality of second heat dissipation fins continuously extending between the plurality of fourth flow paths such that each second heat dissipation fin of the plurality of second heat dissipation fins is between two fourth flow paths of the plurality of fourth flow paths, wherein
cross-sectional areas of the plurality of first heat dissipation fins become greater toward the outer peripheral portion of the base,
cross-sectional areas of the plurality of second heat dissipation fins become greater toward the outer peripheral portion of the base, and
an insulating space is disposed between the first flow path and the second flow path.

2. The substrate support of claim 1, wherein the first flow path and the second flow path are coaxially arranged.

3. The substrate support of claim 2, wherein an insulating space is disposed between the plurality of third flow paths and the plurality of fourth flow paths.

4. The substrate support of claim 2, wherein a ratio of a cross-sectional area of the second flow path to a cross-sectional area of the first flow path is 0.8 to 1.2.

5. The substrate support of claim 2, wherein a height of the plurality of third flow paths decreases toward the outer peripheral portion of the base.

6. The substrate support of claim 2, wherein a diffusion member is disposed in at least one of the first flow path, the second flow path, the plurality of third flow paths, and the plurality of fourth flow paths.

7. The substrate support of claim 1, wherein an insulating space is disposed between the at least one third flow path and the at least one fourth flow path.

8. The substrate support of claim 1, wherein a ratio of a cross-sectional area of the second flow path to a cross-sectional area of the first flow path is 0.8 to 1.2.

9. The substrate support of claim 1, wherein a height of the plurality of third flow paths decreases toward the outer peripheral portion of the base.

10. The substrate support of claim 1, wherein a diffusion member is disposed in at least one of the first flow path, the second flow path, the plurality of third flow paths, and the plurality of fourth flow paths.

11. The substrate support of claim 10, wherein the diffusion member has a concave portion and/or a convex portion.

12. A substrate processing apparatus comprising:
a substrate support,
wherein the substrate support includes:
a base;
a first flow path that opens on a bottom surface of the base at a central portion of the base;
a second flow path that surrounds the first flow path and opens on the bottom surface of the base;
a plurality of third flow paths communicating with the first flow path and arranged from the central portion toward an outer peripheral portion of the base; and
a plurality of fourth flow paths communicating with the second flow path, arranged from the central portion toward the outer peripheral portion of the base, and communicating with the plurality of third flow paths at the outer peripheral portion of the base;
a plurality of first heat dissipation fins between the plurality of third flow paths such that each first heat dissipation fin of the plurality of first heat dissipation fins is between two third flow paths of the plurality of third flow paths; and
a plurality of second heat dissipation fins between the plurality of fourth flow paths such that each second heat dissipation fin of the plurality of second heat dissipation fins is between two fourth flow paths of the plurality of fourth flow paths, wherein cross-sectional areas of the plurality of first heat dissipation fins become greater toward the outer peripheral portion of the base, wherein cross-sectional areas of the plurality of second heat dissipation fins become greater toward the outer peripheral portion of the base, and wherein an insulating space is disposed between the first flow path and the second flow path.

13. The substrate processing apparatus of claim 12, wherein the first flow path and the second flow path are coaxially arranged.

* * * * *